United States Patent
Chang et al.

(10) Patent No.: US 9,991,206 B1
(45) Date of Patent: Jun. 5, 2018

(54) PACKAGE METHOD INCLUDING FORMING ELECTRICAL PATHS THROUGH A MOLD LAYER

(71) Applicant: POWERTECH TECHNOLOGY INC., Hsinchu County (TW)

(72) Inventors: Lien-Chia Chang, Hsinchu County (TW); Chih-Ming Ko, Hsinchu County (TW); Hung-Hsin Hsu, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days. days.

(21) Appl. No.: 15/480,323

(22) Filed: Apr. 5, 2017

(51) Int. Cl.
*H01L 23/02* (2006.01)
*H01L 23/538* (2006.01)
(Continued)

(52) U.S. Cl.
CPC .... *H01L 23/5386* (2013.01); *H01L 21/02068* (2013.01); *H01L 21/0273* (2013.01); *H01L 21/288* (2013.01); *H01L 21/31053* (2013.01); *H01L 21/32139* (2013.01); *H01L 21/486* (2013.01); *H01L 21/4853* (2013.01); *H01L 21/4857* (2013.01); *H01L 21/565* (2013.01); *H01L 23/13* (2013.01); *H01L 23/3128* (2013.01); *H01L 23/49816* (2013.01); *H01L 23/5383* (2013.01); *H01L 23/5384* (2013.01); *H01L 23/5385* (2013.01); *H01L 23/5389* (2013.01); *H01L 24/16* (2013.01); *H01L 24/81* (2013.01); *H01L 2224/16227* (2013.01); *H01L 2224/81191* (2013.01); *H01L 2924/0105* (2013.01); *H01L 2924/01013* (2013.01); *H01L 2924/01029* (2013.01); *H01L 2924/01079* (2013.01); *H01L 2924/15153* (2013.01); *H01L 2924/15331* (2013.01)

(58) Field of Classification Search
CPC ............. H01L 23/5386; H01L 23/3128; H01L 23/49813; H01L 23/5383; H01L 21/486; H01L 21/565; H01L 21/31053
USPC ......................................................... 257/686
See application file for complete search history.

(56) References Cited

U.S. PATENT DOCUMENTS 6,506,633 B1 1/2003 Cheng
8,658,464 B2 * 2/2014 Cheng .................... B29C 39/10
257/778
(Continued)

FOREIGN PATENT DOCUMENTS

TW        I500137 B      9/2015
TW        201603216 A    1/2016

*Primary Examiner* — Nitin Parekh
(74) *Attorney, Agent, or Firm* — Winston Hsu

(57) ABSTRACT

A package method includes disposing a chip and a plurality of solder bumps on a substrate by disposing a plurality of chip interfaces and the plurality of solder bumps on a plurality of first interfaces of the substrate respectively; forming a mold layer configured to encapsulate the chip and the plurality of solder bumps; grinding the mold layer to obtain a grinded mold layer and expose a top side of the chip; drilling the grinded mold layer to form a plurality of through holes corresponding to the plurality of solder bumps; and applying a conductive material to fill the plurality of through holes with the conductive material to form a plurality of electrical paths through the grinded mold layer and electrically couple to the plurality of solder bumps.

20 Claims, 17 Drawing Sheets

(51) Int. Cl.
*H01L 21/48* (2006.01)
*H01L 21/56* (2006.01)
*H01L 23/00* (2006.01)
*H01L 23/31* (2006.01)
*H01L 21/3105* (2006.01)
*H01L 21/288* (2006.01)
*H01L 23/498* (2006.01)
*H01L 21/027* (2006.01)
*H01L 21/3213* (2006.01)
*H01L 21/02* (2006.01)
*H01L 23/13* (2006.01)

(56) References Cited

U.S. PATENT DOCUMENTS

| | | | | |
|---|---|---|---|---|
| 8,716,065 B2* | 5/2014 | Chi | ............... | H01L 23/3135 257/686 |
| 2007/0290376 A1* | 12/2007 | Zhao | ............... | H01L 21/56 257/787 |
| 2008/0136004 A1* | 6/2008 | Yang | ............... | H01L 24/96 257/686 |
| 2009/0315156 A1* | 12/2009 | Harper | ............... | H01L 23/552 257/660 |
| 2011/0227209 A1* | 9/2011 | Yoon | ............... | H01L 23/3128 257/686 |
| 2011/0260334 A1* | 10/2011 | Hasegawa | ............... | H01L 21/481 257/774 |
| 2011/0304015 A1* | 12/2011 | Kim | ............... | H01L 23/552 257/532 |
| 2012/0074586 A1* | 3/2012 | Seo | ............... | H01L 25/16 257/774 |
| 2012/0211885 A1* | 8/2012 | Choi | ............... | H01L 23/3128 257/737 |
| 2012/0280404 A1* | 11/2012 | Kwon | ............... | H01L 23/3737 257/777 |
| 2013/0105991 A1* | 5/2013 | Gan | ............... | H01L 25/105 257/777 |
| 2013/0270682 A1* | 10/2013 | Hu | ............... | H01L 23/5389 257/666 |
| 2014/0203452 A1* | 7/2014 | Oganesian | ............... | H01L 23/481 257/774 |
| 2014/0273348 A1* | 9/2014 | Yim | ............... | H01L 23/10 438/107 |

* cited by examiner

US 9,991,206 B1

PACKAGE METHOD INCLUDING FORMING ELECTRICAL PATHS THROUGH A MOLD LAYER

BACKGROUND OF THE INVENTION

1. Field of the Invention

The present invention relates to a package method, and more particularly, a package method including forming electrical paths through a mold layer.

2. Description of the Prior Art

When forming a mold layer in a package process, an often used means is filling a mold material such as an epoxy mold compound into a mold tool, and then removing the mold tool after the mold material has solidified to form the mold layer. If the height of the mold layer is unnecessary to be accurate, the above process may be feasible. However, when needing a mold layer with a small and accurate height, the yield may be low with using the above process. To produce and use a small sized mold tool accurately may be difficult. Besides, undesired excess glue may flow to contaminate a chip when filling the mold material using a mold tool with a small height.

SUMMARY OF THE INVENTION

An embodiment of the present invention provides a package method. The package method includes disposing a chip and a plurality of solder bumps on a substrate by disposing a plurality of chip interfaces and the plurality of solder bumps on a plurality of first interfaces of the substrate respectively; forming a mold layer configured to encapsulate the chip and the plurality of solder bumps; grinding the mold layer to obtain a grinded mold layer and expose a top side of the chip; drilling the grinded mold layer to form a plurality of through holes corresponding to the plurality of solder bumps; and applying a conductive material to fill the plurality of through holes with the conductive material to form a plurality of electrical paths through the grinded mold layer and electrically coupled to the plurality of solder bumps.

Another embodiment of the present invention provides a package method. The a package method includes disposing a chip and a plurality of solder bumps on a substrate by disposing a plurality of chip interfaces and the plurality of solder bumps on a plurality of first interfaces of the substrate respectively; forming a mold layer configured to encapsulate the chip and the plurality of solder bumps; grinding the mold layer to obtain a grinded mold layer and expose a top side of the chip; drilling the mold layer to form a plurality of through holes corresponding to the plurality of solder bumps; applying a conductive material to form a conductive layer and fill the plurality of through holes with the conductive material to form a plurality of electrical paths electrically coupled to the plurality of solder bumps respectively, the conductive layer covering the plurality of electrical paths; and patterning the conductive layer to form a redistribution layer electrically coupled to the plurality of electrical paths; wherein the plurality of solder bumps are electrically connected with the chip via circuitry of the substrate and the plurality of chip interfaces.

Another embodiment of the present invention provides a package structure including a substrate, a chip, a plurality of solder bumps, a mold layer, a plurality of through holes and a plurality of electrical paths. The substrate includes a first side, a second side, a circuitry formed between the first side and the second side, and a plurality of first interfaces formed on the first side and configured to be electrically connected with the circuitry. The chip includes a top side, a bottom side and a plurality of chip interfaces formed on the bottom side of the chip. The chip is disposed on the first side of the substrate by electrically connecting the plurality of chip interfaces to a first set of the plurality of first interfaces of the substrate respectively. The chip has a first height. The plurality of solder bumps are disposed on the first side of the substrate by electrically connecting the plurality of solder bumps to a second set of the plurality of first interfaces of the substrate respectively. Each of the plurality of solder bumps has a second height. The mold layer is formed on the first side of the substrate and used to encapsulate the chip and the plurality of solder bumps. The plurality of through holes is formed by drilling the mold layer and located corresponding to the plurality of solder bumps. The plurality of electrical paths are formed by filling the plurality of through holes with a conductive material, located corresponding to the plurality of solder bumps, and used to be electrically connected with the chip via the plurality of solder bumps and the circuitry of the substrate. Each of the plurality of electrical paths has a third height. The first height is substantially equal to a sum of the second height and the third height so that the top side of the chip is substantially exposed from the mold layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
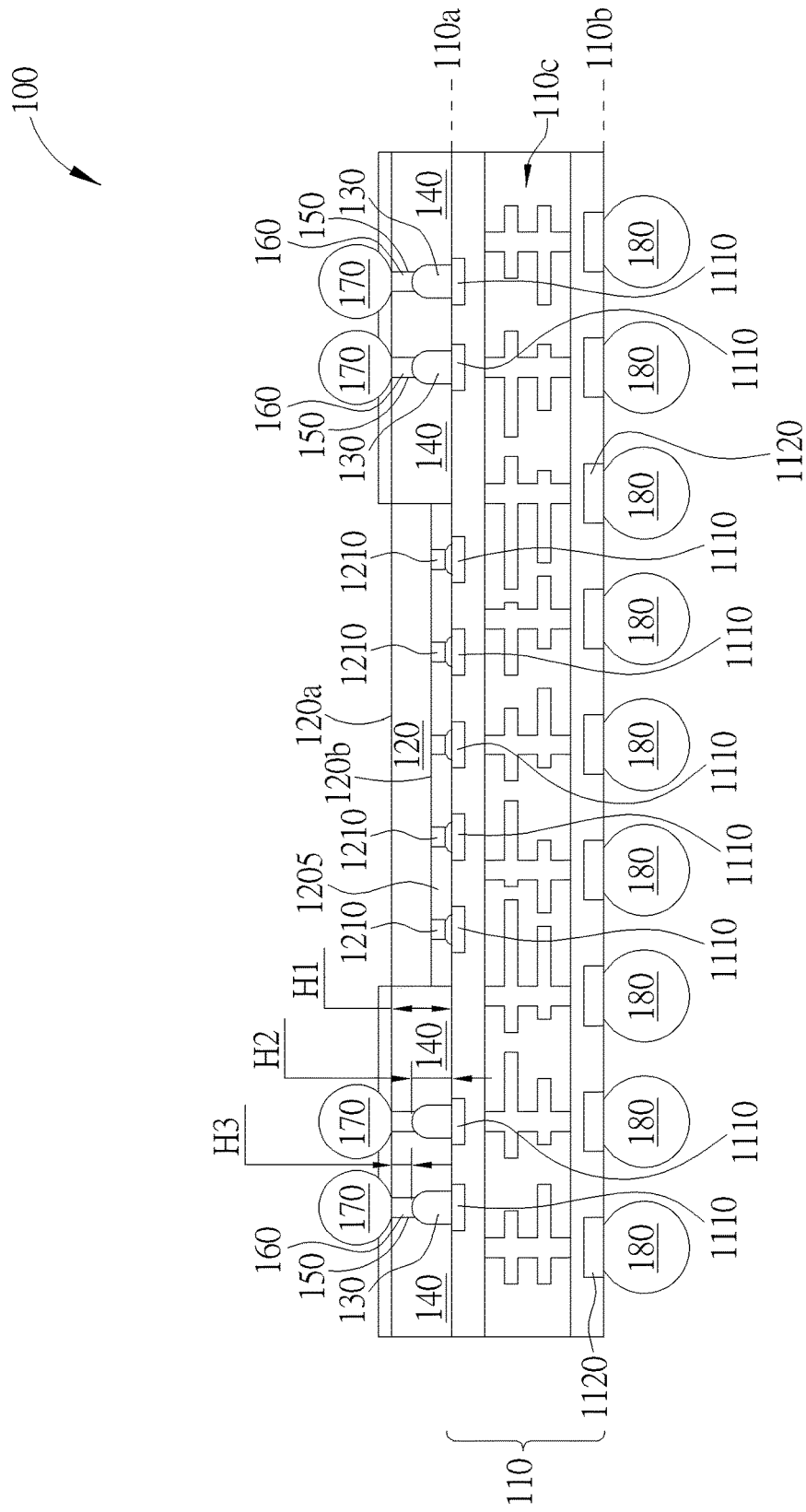
FIG. 1 illustrates a package structure according to an embodiment of the present invention.

FIG. 1 illustrates a package structure 100 according to an embodiment of the present invention. The package structure 100 may include a substrate 110, a chip 120, a plurality of solder bumps 130, a mold layer 140, a plurality of through holes 150, and a plurality of electrical paths 160. The substrate 110 may include a first side 110*a*, a second side 110*b*, a circuitry 110*c* formed between the first side 110*a* and the second side 110*b*, and a plurality of first interfaces 1110 formed on the first side 110*a* and used to electrically connect to the circuitry 110*c*. The circuitry 110*c* may be designed according to requirements. The chip 120 may include a top side 120a, an active side 120b and a plurality of chip interfaces 1210 formed on the active side 120b. The chip 120 may be disposed on the first side 110a of the substrate 110 by coupling the chip interfaces 1210 to a first set of the first interfaces 1110 of the substrate 100 correspondingly. An underfill layer 1205 may be formed by filling an underfill material such as epoxy in the gap between the substrate 110 and the chip 120. A distance from the first side 120a of the chip 120 to the substrate 110 may be a first height H1. The solder bumps 130 may be disposed on the side 110a of the substrate 110 by soldering the solder bumps 130 to a second set of the first interfaces 1110 of the substrate 110 correspondingly. Each of the solder bumps 130 may have a second height H2. The mold layer 140 may be formed on the side 110a of the substrate 110 and encapsulate the chip 120 and the solder bumps 130. Above each of the solder bumps 130, the through holes 150 may be formed by drilling the mold layer 140. The electrical paths 160 may be formed by filling the through holes 150 with a conductive material. The electrical paths 160 may be located corresponding to the solder bumps 130. The electrical paths 160 may be used to electrically connect with the chip 120 through the solder bumps 130 and the circuitry 110c of the substrate 110. The conductive material may be copper, gold, aluminum, tin, or other suitable alloy. Each of the electrical paths 150 may have a third height H3. The first height H1 may be substantially equal to a sum of the second height H2 and the third height H3. In this way, the top side 120a of the chip 120 and the electrical paths 160 may be substantially coplanar to the mold layer 140. The package structure 100 may further include a plurality of first solder balls 170 disposed on the mold layer 140 and electrically connected to the electrical paths 160 correspondingly. As shown in FIG. 1, the substrate 110 may further include a plurality of second interfaces 1120 formed on the side 110b of the substrate 110. The second interfaces 1120 may be electrically connected with the circuitry 110c of the substrate 110. The package structure 100 may further include a plurality of second solder balls 180 disposed on the second interfaces 1120 of the substrate 110. The second solder balls 180 may be electrically connected with the chip 120 through the circuitry 110c of the substrate 110.

Figure 2:
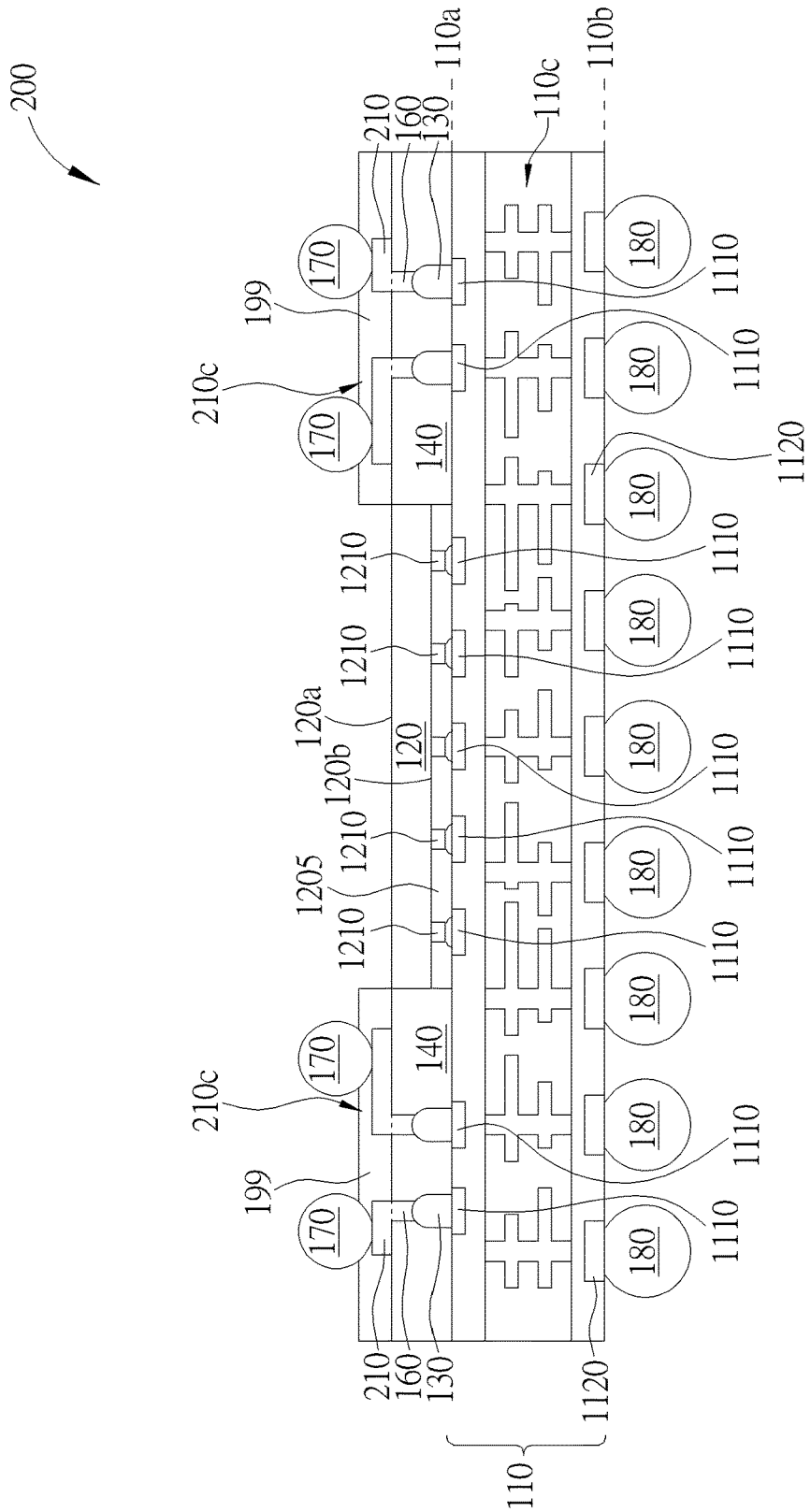
FIG. 2 illustrates a package structure according to another embodiment of the present invention.

FIG. 2 illustrates a package structure 200 according to another embodiment of the present invention. The structure 200 may include the substrate 110, the chip 120, the solder bumps 130, the mold layer 140, and the electrical paths 160 formed in the through holes 150. The package structure 200 may further include a redistribution layer 210. The redistribution layer 210 may be formed by patterning a conductive layer formed on the mold layer 140. The redistribution layer 210 may be electrically connected to the electrical paths 160. The redistribution layer 210 may include a redistribution circuit 210c. The first solder balls 170 may be electrically connected with the chip 120 via the redistribution layer 210. The use of the redistribution circuit 210c may improve the flexibility of designing the package structure 200. A solder mask layer 199 may be formed to protect regions of the redistribution layer 210 that is not soldered to the first solder balls 170.

Figure 3:
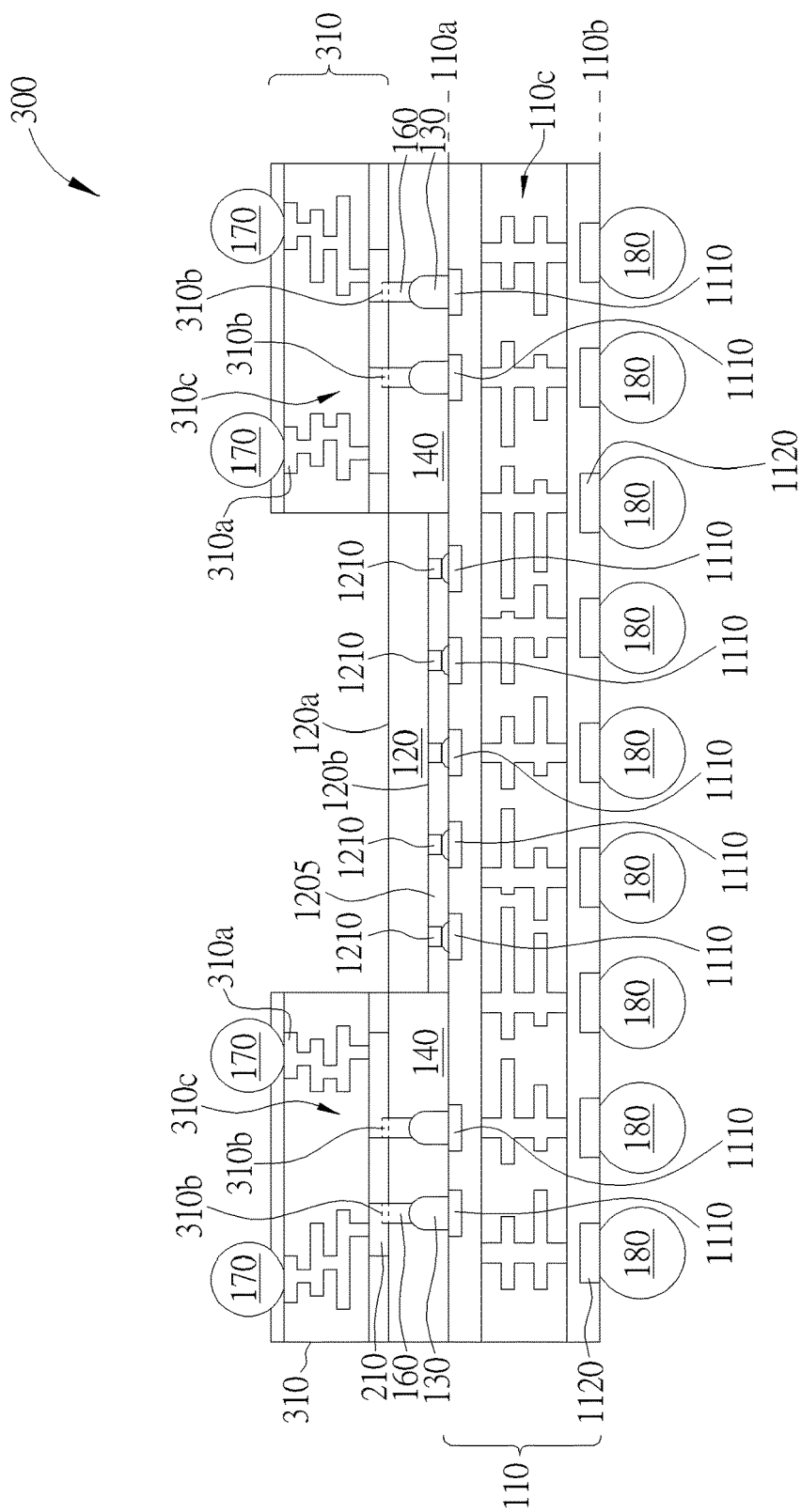
FIG. 3. illustrates a package structure according to another embodiment of the present invention.

FIG. 3. illustrates a package structure 300 according to another embodiment of the present invention. The package structure 300 may be similar to the package structure 100, however, the package structure 300 may further include a redistribution layer 310 formed on the mold layer 140. The redistribution layer 310 may be of a multi-layer structure. The redistribution layer 310 may be electrically connected to the electrical paths 160 and may include a set of dielectric layers and a set of circuit layers. The redistribution layer 310 may include redistribution circuit 310c, a plurality of first interfaces 310a and a plurality of second interfaces 310b. The second interfaces 310b may be electrically coupled to the electrical paths 160 correspondingly. The first solder balls 170 may be disposed on the first interfaces 310a and may be electrically connected with the chip 120 through the redistribution circuit 310c, the electrical paths 160, and the circuit 110c of the substrate 110. The redistribution circuit 310c may be designed to be a multi-layer circuit structure. Thus, a more flexible and complicated design may be obtained using the package structure 300. Similar to the package structure 100, the package structures 200-300 may include the second solder balls 180 coupled to the second interfaces 1120 of the substrate 110 so that a device (e.g. an external chip) coupled to the first solder balls 170 and/or the chip 120 may be electrically connected to another device (e.g. a printed-circuit board) coupled to the second solder balls 180.

Figure 4:
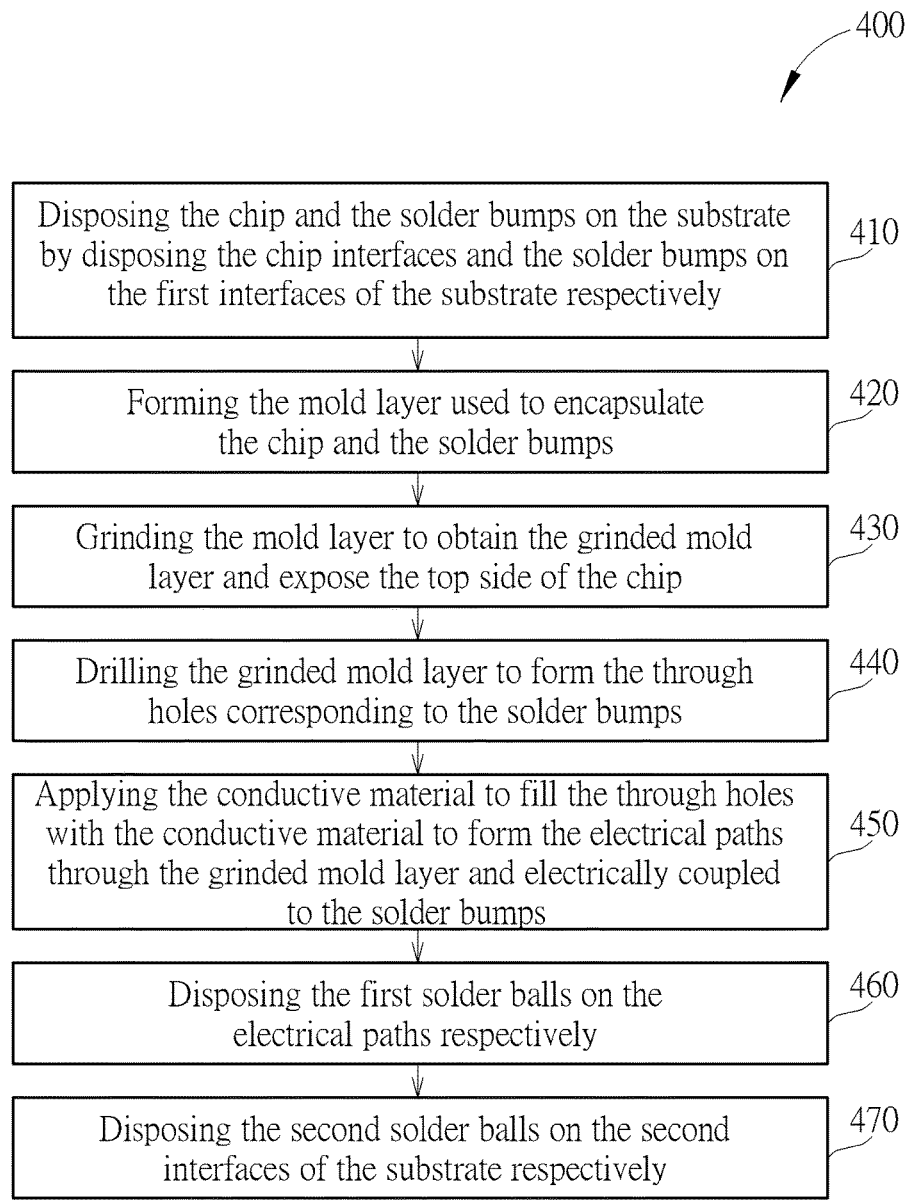
FIG. 4 illustrates a flowchart of a package method for manufacturing the package structure of FIG. 1 according to an embodiment of the present invention.

FIG. 4 illustrates a flowchart of a package method 400 for manufacturing the package structure 100 of FIG. 1 according to an embodiment of the present invention. FIGS. 5-10 illustrate the package structure 100 in process corresponding to the steps of FIG. 4. The package method may 400 include:

Step 410: dispose the chip 120 and the solder bumps 130 on the substrate 110 by coupling the chip interfaces 1210 and the solder bumps 130 on the first interfaces 1110 of the substrate 110 correspondingly;

Step 420: form the mold layer 140 to encapsulate the chip 120 and the solder bumps 130;

Step 430: grind the mold layer 140 to expose the top side 120a of the chip 120;

Step 440: drill the grinded mold layer 140 to form the through holes 150 corresponding to the solder bumps 130;

Step 450: fill the through holes 150 with a conductive material to form the electrical paths 160 in the mold layer 140 and electrically coupled to the solder bumps 130;

Step 460: dispose the first solder balls 170 on the electrical paths 160 correspondingly; and Step 470: dispose the second solder balls 180 on the second interfaces 1120 of the substrate 110 correspondingly.

Figure 5:
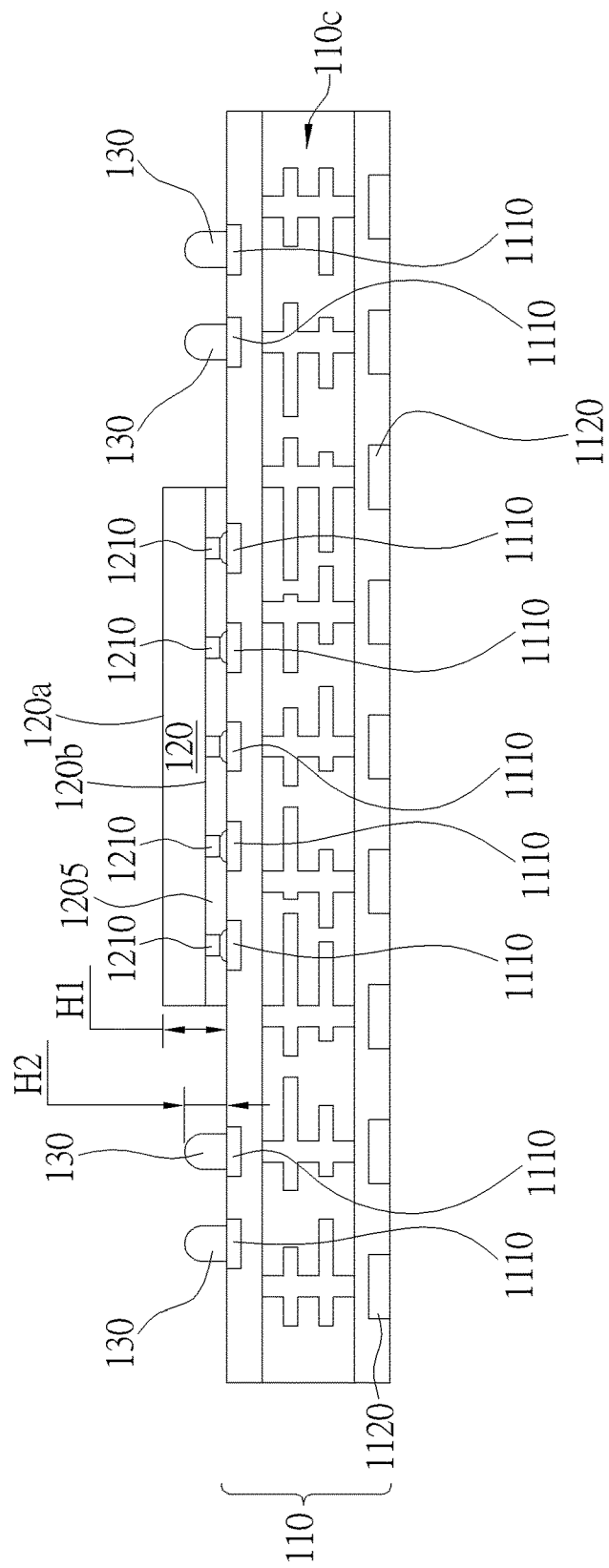
FIGS. 5-10 illustrate the package structure in process corresponding to the steps of FIG. 4.
Figure 6:
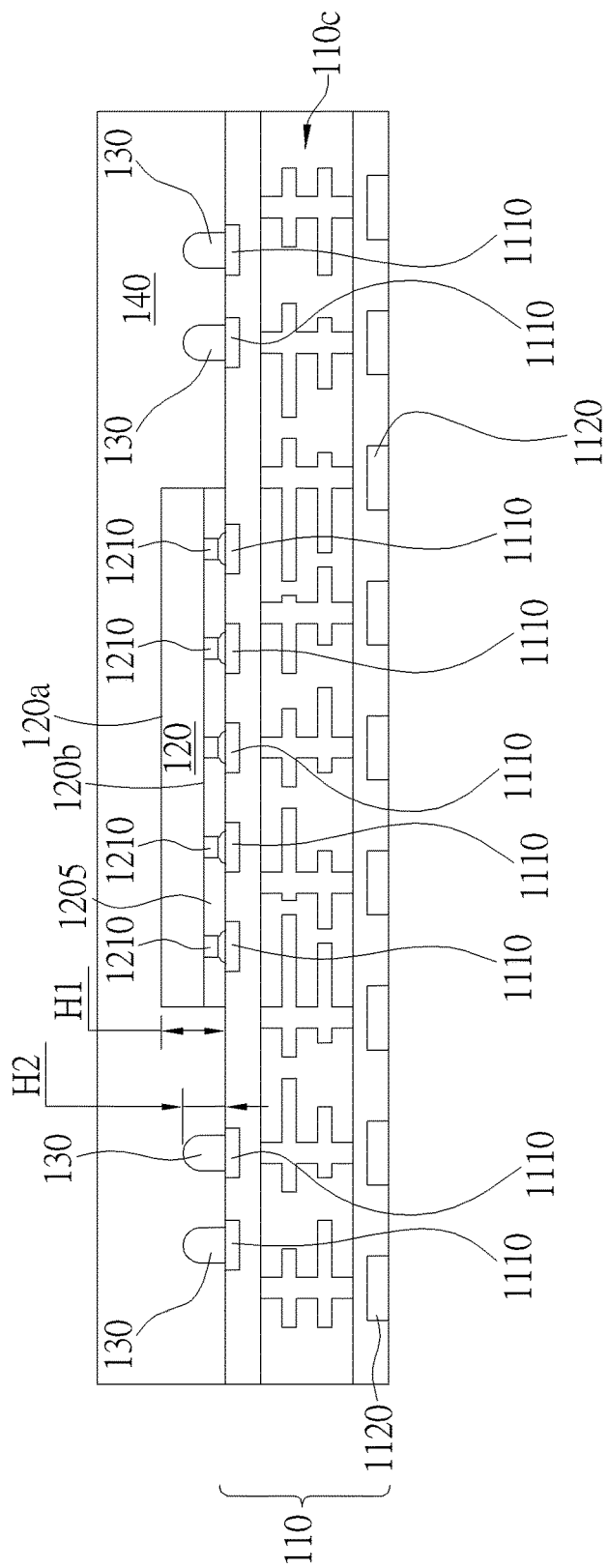
Figure 7:
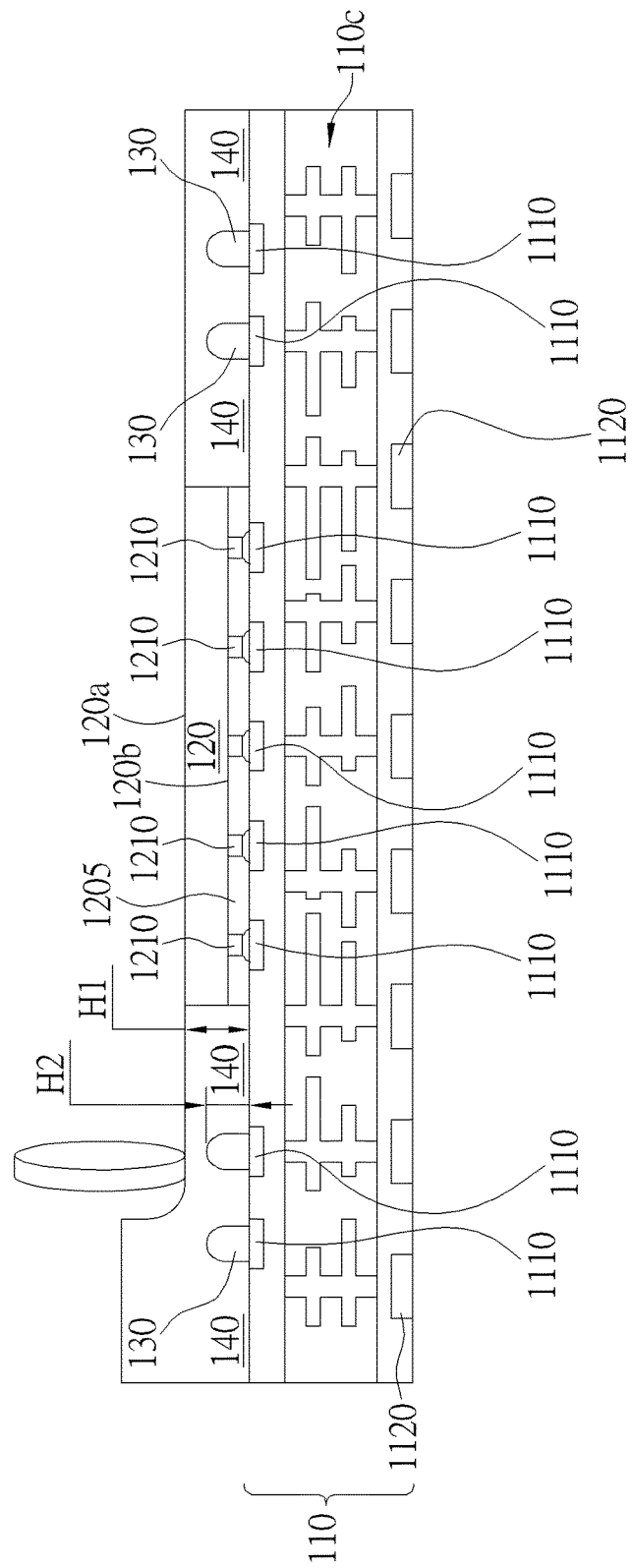
Figure 8:
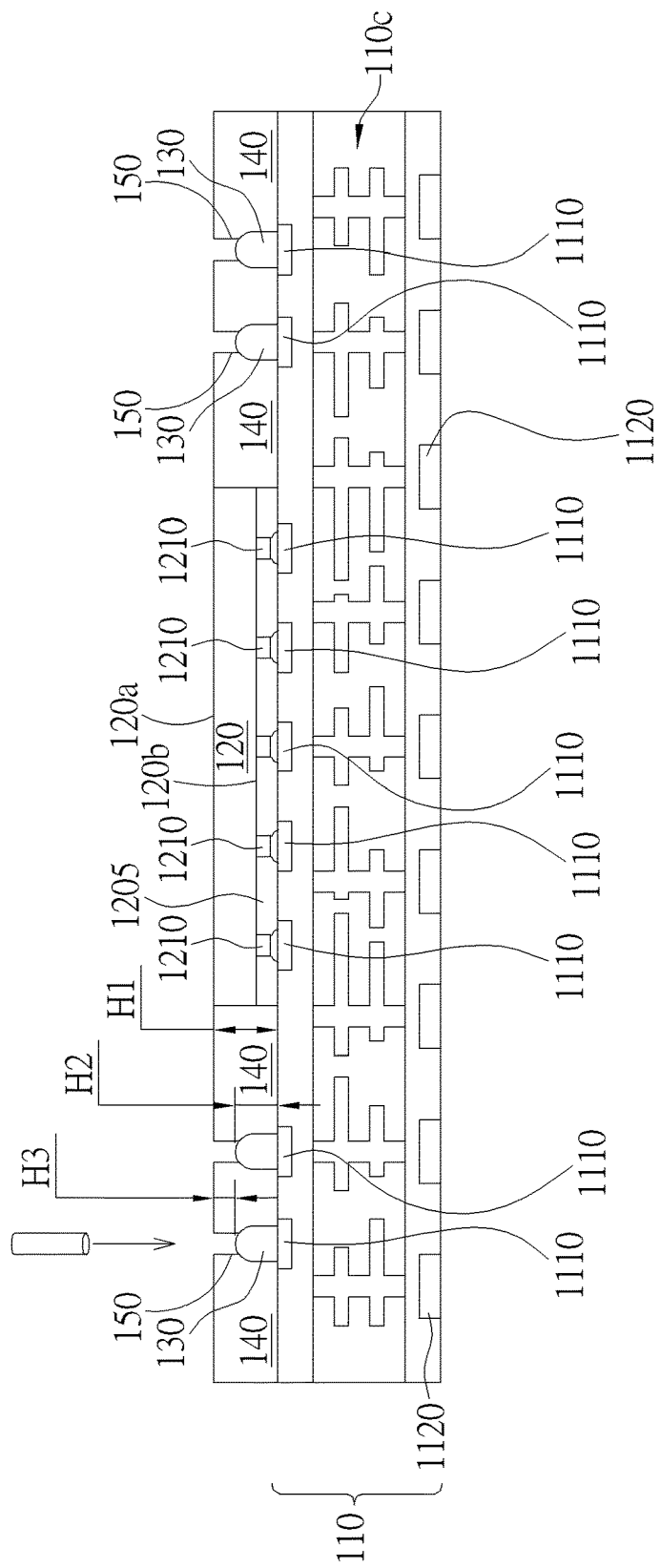
Figure 9:
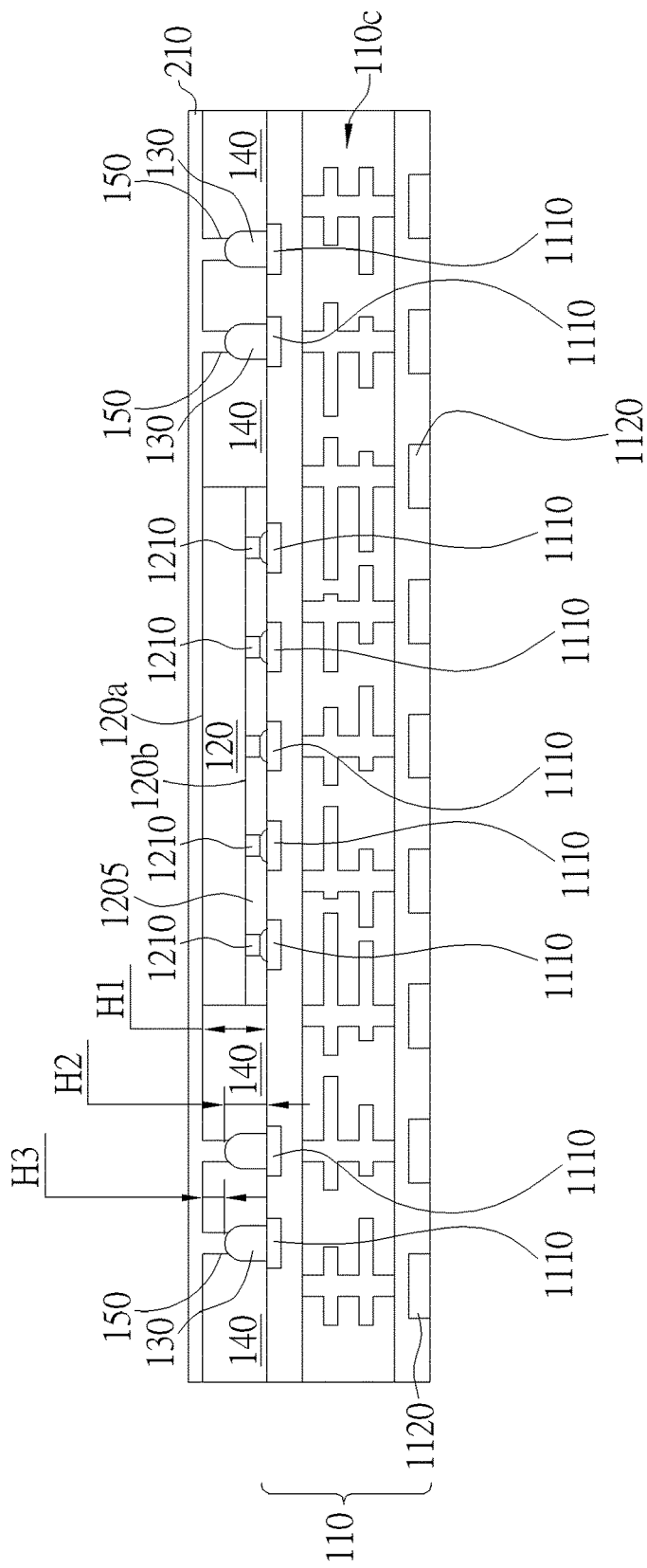
Figure 10:
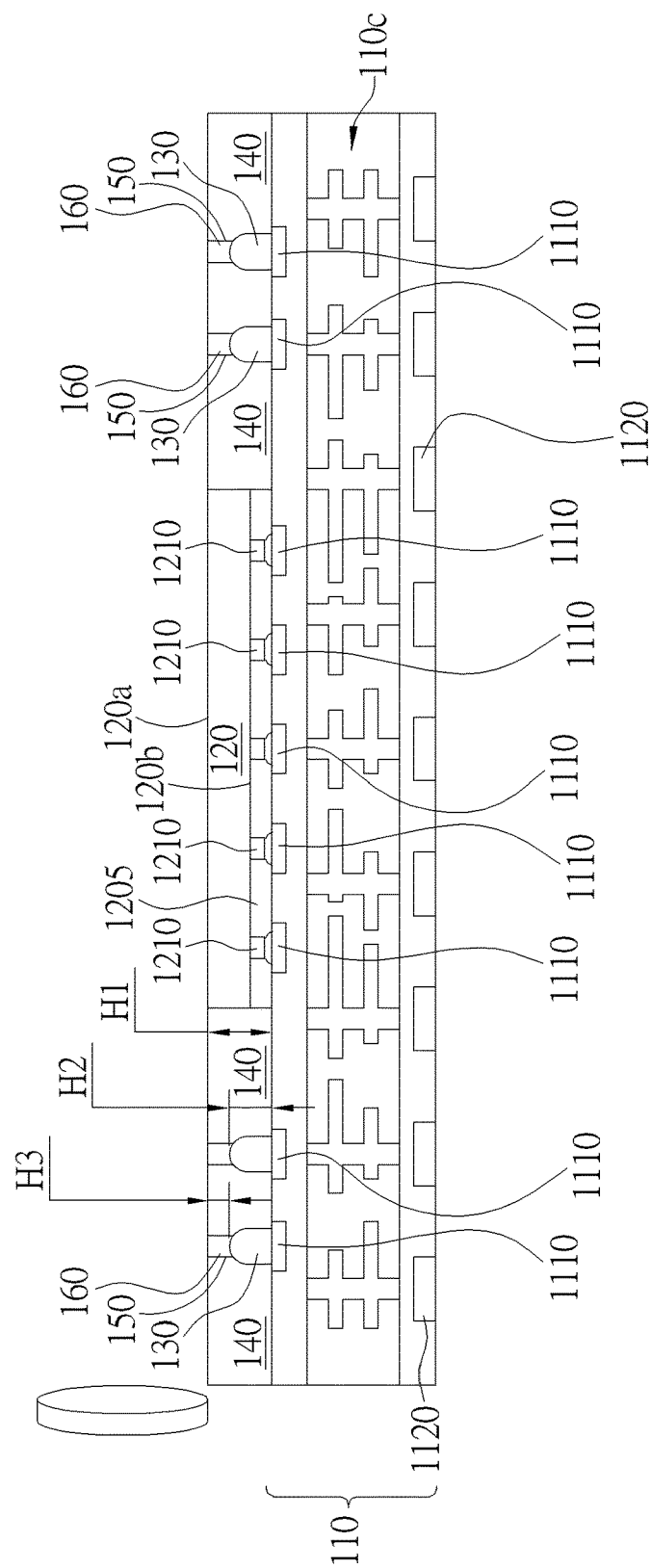

FIG. 5 may correspond to Step 410. FIGS. 6-7 may correspond to Steps 420-430. FIG. 8 may correspond to Step 440. FIGS. 9-10 may correspond to Step 450. FIG. 1 may correspond to Steps 460-470. In Step 440, laser drilling may be used to drill the mold layer 140. In FIG. 9, the conductive material may be applied through electroplating to fill the through holes 150 with the conductive material and form a conductive layer over the mold layer 140. Then, at least a portion of the conductive layer may be removed. In FIG. 10, the remainder of the conductive layer may form the electrical paths 160. In FIG. 10, the undesired portion of the conductive layer may be removed by grinding, etching or another suitable means. In Step 450, the conductive material may be applied by electroplating (e-plating). The package structure 100 of FIG. 1 may be a structure manufactured after the structure shown in FIG. 10. When soldering the first and second solder balls 170 and 180, solder mask layers may be formed to cover and protect regions where soldering process is not performed. As shown in FIG. 10 and FIG. 1, the chip 120 may be exposed through the mold layer 140 to have better heat dissipation. In FIG. 1, first and second solder balls 170-180 may be used to couple to other devices such as an external chip or a printed circuit board.

Trying to build a set of electrical paths though a mold layer in the field may be a challenge. A possible means may be disposing a set of conductive pillars (e.g. copper pillars) on a substrate, and then form a mold layer to encapsulate the conductive pillars so that the conductive pillars may act as electrical paths through the mold layer. However, the yield and cost may be high because it may be difficult to securely fix the conductive pillars to the substrate. It may be also difficult to form a pillar structure with electroplating. The height of the mold layer may be difficult to control to be the same as the height of the conductive pillars. Using the process shown in FIGS. 5-10, the above difficulties may be well solved. By using a suitable grinding wheel in Step 430, the accuracy of grinding the mold layer 140 may be high enough to expose the chip 120 without damaging the chip 120. In Steps 440-450, it is feasible to cohere and deposit the conductive material (e.g. copper) on the solder bumps 130 to form the electrical paths 160. For example, the height H3 (shown in FIGS. 1 and 8) of the electrical path 160 may be less than 50 micrometer. It is easier to form an electrical path with a lower height. Hence, engineering difficulty and cost may be reduced, and the yield may be improved.

Figure 11:
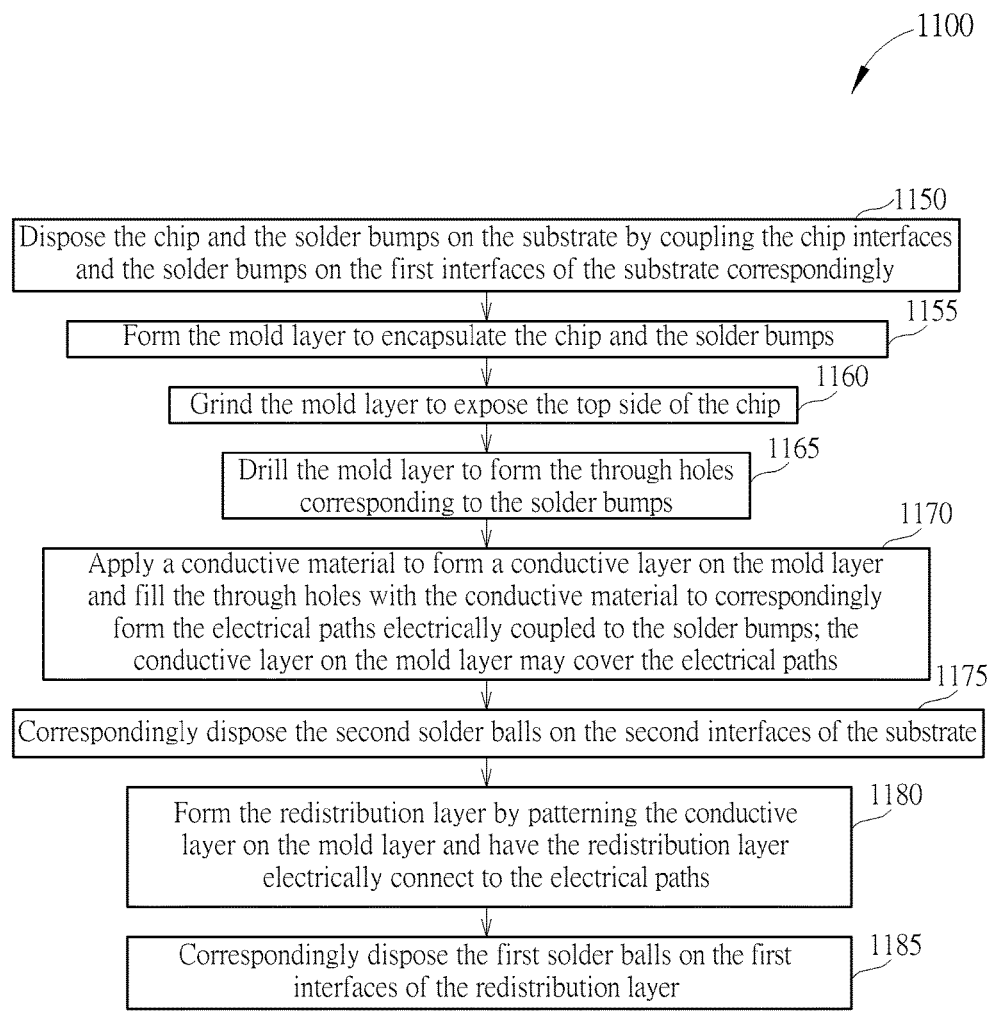
FIG. 11 illustrates a flowchart of a package method for manufacturing the package structure of FIG. 2 according to an embodiment of the present invention.

FIG. 11 illustrates a flowchart of a package method 1100 for manufacturing the package structure 200 of FIG. 2 according to an embodiment of the present invention. The package method 1100 may include:

Step 1150: dispose the chip 120 and the solder bumps 130 on the substrate 110 by coupling the chip interfaces 1210 and the solder bumps 130 on the first interfaces 1110 of the substrate 110 correspondingly;

Step 1155: form the mold layer 140 to encapsulate the chip 120 and the solder bumps 130;

Step 1160: grind the mold layer 140 to expose the top side 120a of the chip 120;

Step 1165: drill the mold layer 140 to form the through holes 150 corresponding to the solder bumps 130;

Step 1170: apply a conductive material to form a conductive layer on the mold layer 140 and fill the through holes 150 with the conductive material to correspondingly form the electrical paths 160 electrically coupled to the solder bumps 130; the conductive layer on the mold layer 140 may cover the electrical paths 160;

Step 1175: correspondingly dispose the second solder balls 180 on the second interfaces 1120 of the substrate 110;

Step 1180: form the redistribution layer 210 by patterning the conductive layer on the mold layer 140 and have the redistribution layer 210 electrically connect to the electrical paths 160; and Step 1185: correspondingly dispose the first solder balls 170 on the first interfaces of the redistribution layer 210.

Step 1150-1175 and 1185 may be similar to Steps 410-470 of FIG. 4. As shown in FIG. 11, step 1180 may be performed to pattern the conductive layer to form the redistribution layer 210. The conductive layer on the mold layer 140 may be formed by electroplating. The conductive layer on the mold layer 140 may be etched, and the remainder of the conductive layer may become the redistribution layer 210. As mentioned above, using the redistribution layer 210 may allow a more flexible design.

Figure 15:
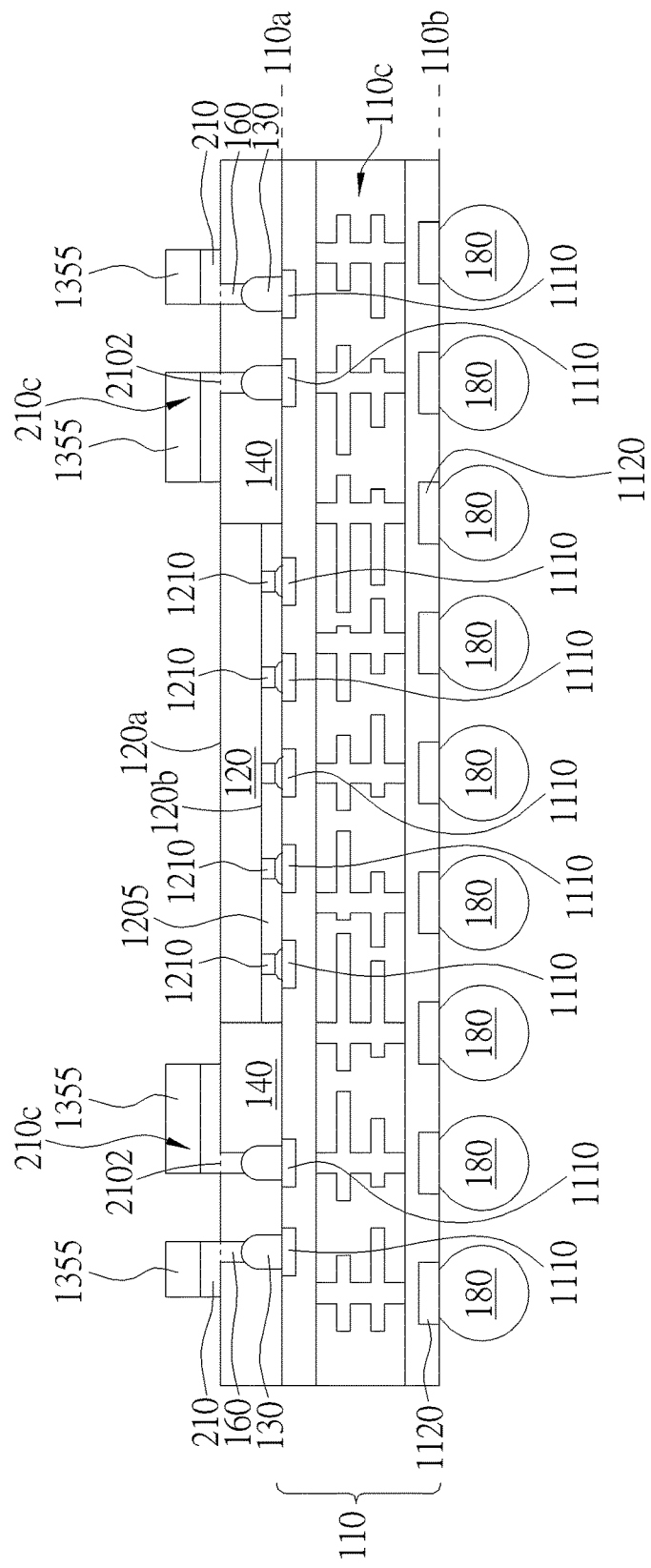
Figure 16:
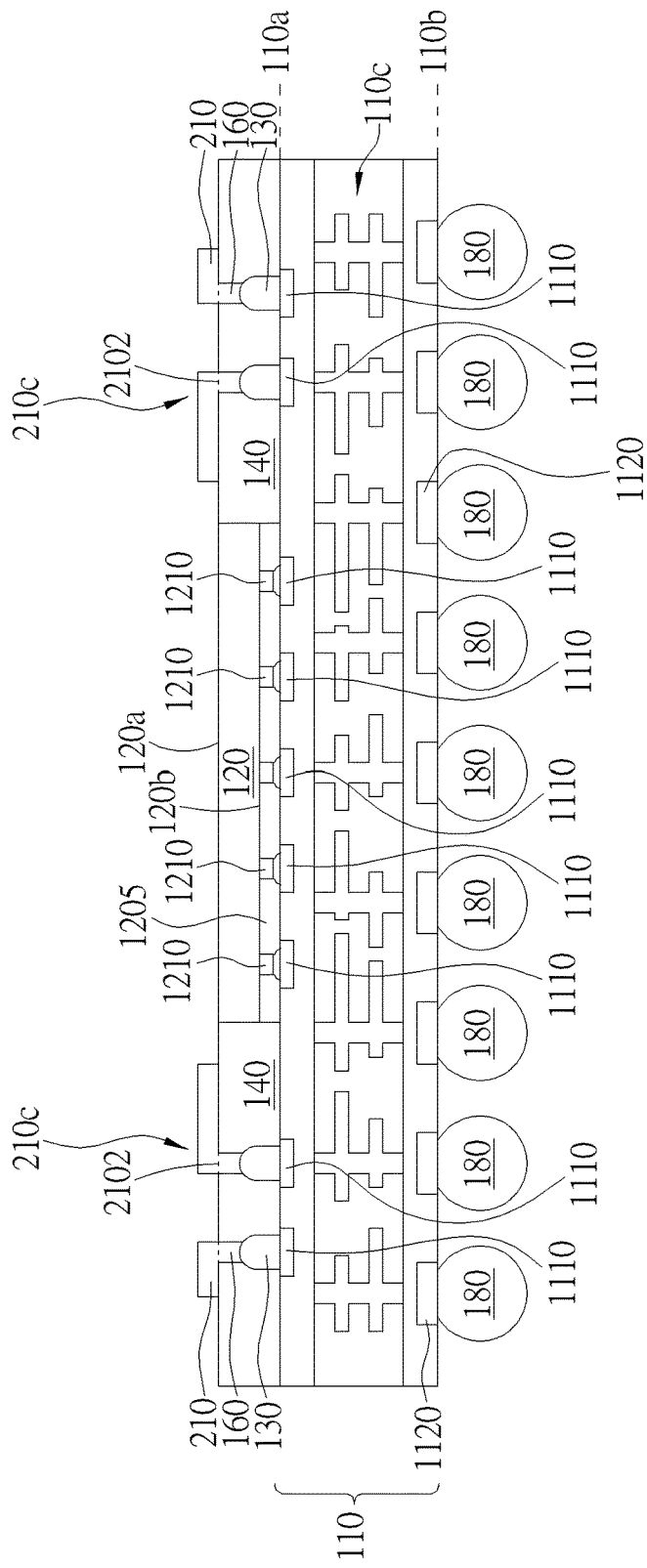
Figure 17:
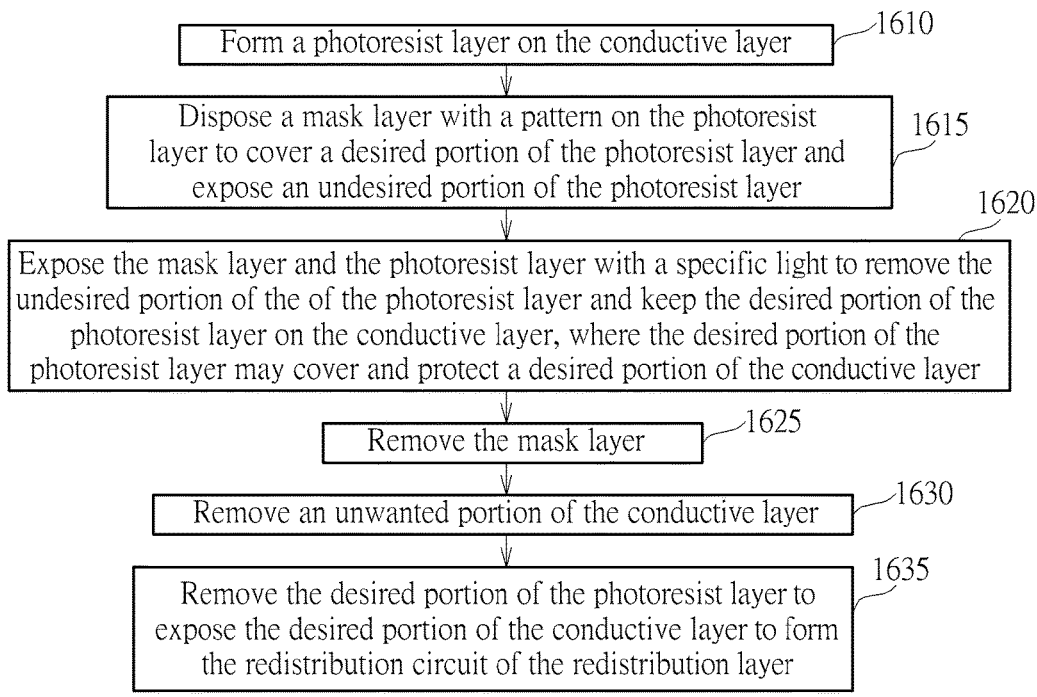
FIG. 17 illustrates a flowchart of the detailed steps of Step 1180 according to an embodiment of the present invention.

Regarding step 1180, detailed description of the steps may be provided below in correspondence with FIGS. 12-16. FIG. 17 illustrates a flowchart of the steps of Step 1180 according to an embodiment of the present invention. Patterning the conductive layer to form the redistribution layer 210 of step 1180 may include:

Step 1610: form a photoresist layer 1285 on the conductive layer;

Step 1615: dispose a mask layer 1355 with a pattern on the photoresist layer 1285 to cover a desired portion of the photoresist layer 1285 and expose an undesired portion of the photoresist layer 1285;

Step 1620: expose the mask layer 1355 and the photoresist layer 1285 with a specific light to remove the undesired portion of the of the photoresist layer 1285 and keep the desired portion of the photoresist layer 1285 on the conductive layer, where the desired portion of the photoresist layer 1285 may cover and protect a desired portion of the conductive layer;

Step 1625: remove the mask layer 1355;

Step 1630: remove an unwanted portion of the conductive layer; and

Step 1635: remove the desired portion of the photoresist layer 1285 to expose the desired portion of the conductive layer to form the redistribution circuit 210c of the redistribution layer 210.

Figure 12:
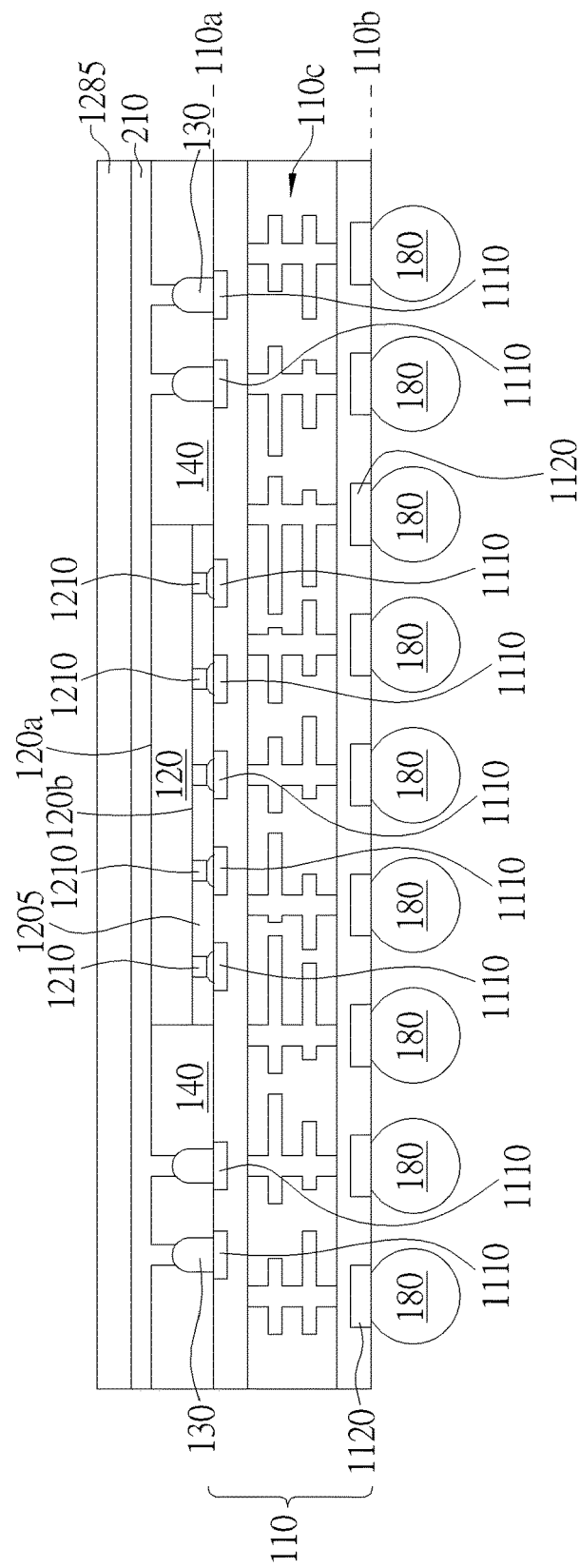
FIGS. 12-16 illustrate the package structure in process corresponding to Step 1180 of FIG. 11.
Figure 13:
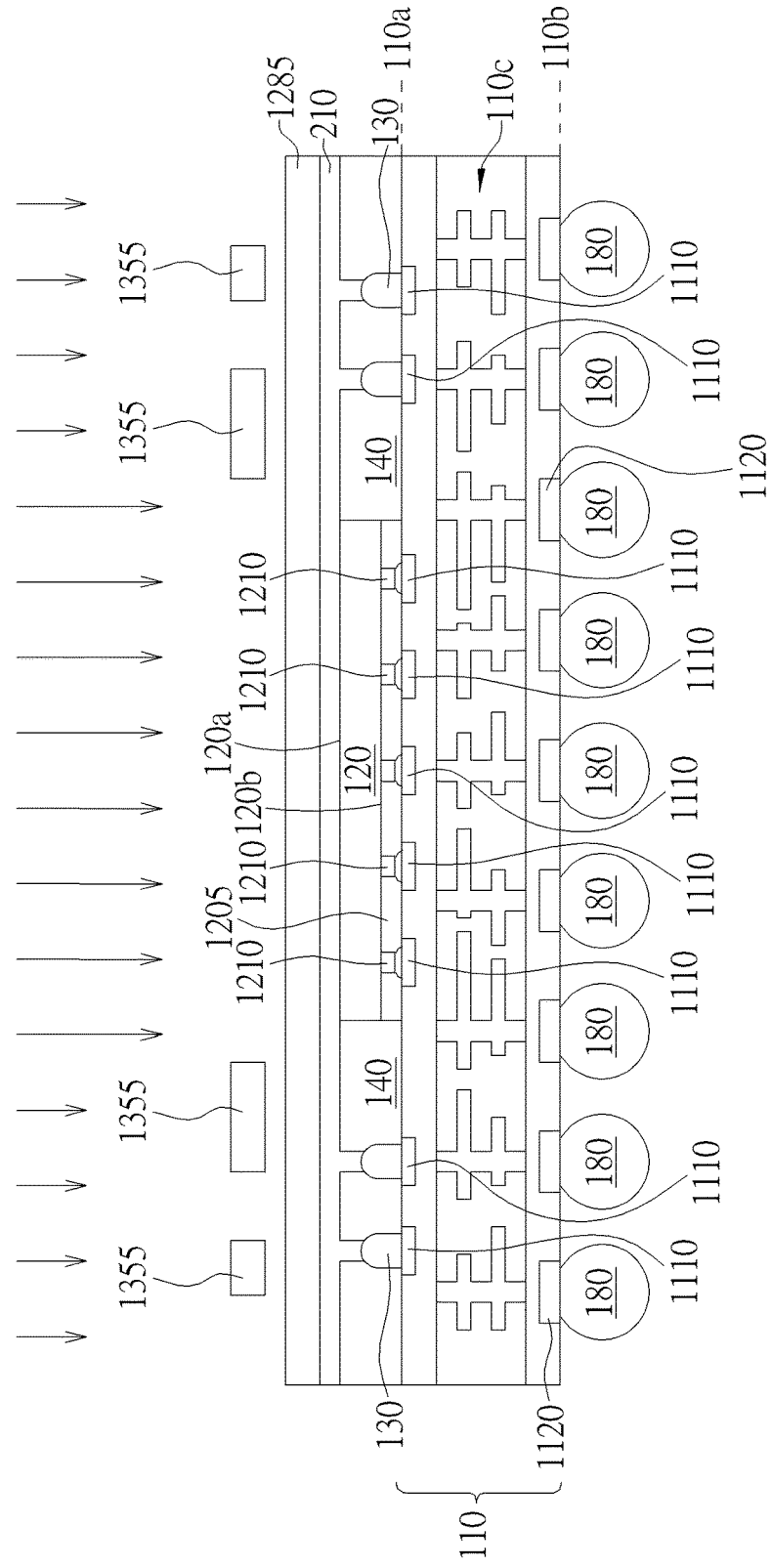
Figure 14:
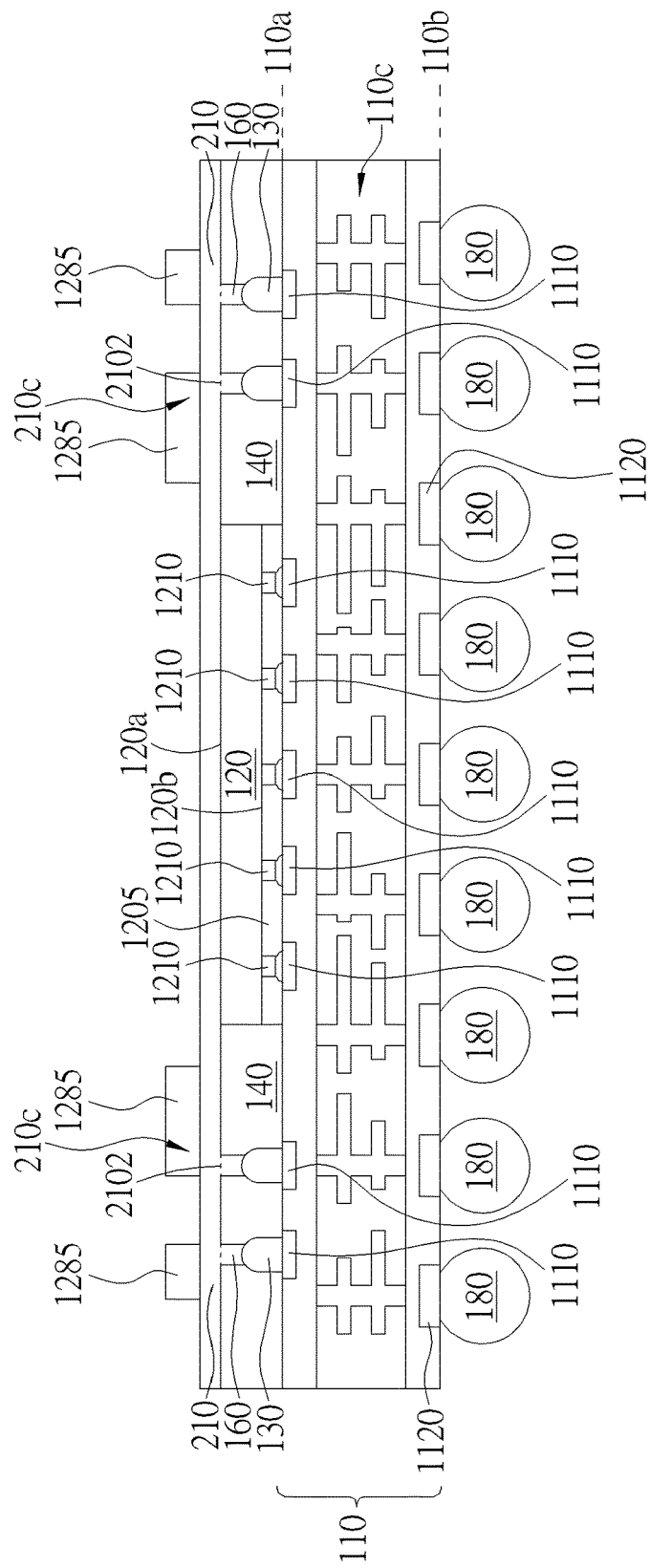

The package structure shown in FIG. 12 illustrates the second solder balls 180 being disposed on the substrate 150. FIG. 12 may correspond to Step 1610. FIG. 13 may correspond to Steps 1615-1620. FIG. 14 may correspond to Step 1625. FIG. 15 may correspond to Step 1630. FIG. 16 may correspond to Steps 1635-1640. In Step 1615, depending on the type of the photoresist used, the reverse may also be applicable to cover the undesired portion of the photoresist layer and expose the desired portion of the photoresist layer. In Step 1620, the specific light may have a specific wavelength of light corresponding to the material of the photoresist layer 1285. In Step 1630, the unwanted portion of the conductive layer may be removed by etching, and a cleaning process may be performed to remove unwanted contaminants after etching the conductive layer. As shown in FIG. 2, the solder mask layer 199 may be formed on a portion of the etched conductive layer (i.e. the redistribution layer) to cover regions that does not need to undergo soldering process and expose the first interfaces.

FIGS. 11-16 illustrate a process of patterning the single conductive layer. Regarding FIG. 3, any number of conductive layers and/or dielectric layers may be formed and disposed alternatively to form the redistribution layer 310. The redistribution layer 310 may include X intermediary conductive layers and Y intermediary dielectric layers. X and Y may be positive integers. The X intermediary conductive layers and Y intermediary dielectric layers may be patterned so that the patterned X intermediary conductive layers and the patterned Y intermediary dielectric layers may form a redistribution layer 310 with a redistribution circuit 310c. A portion of the X intermediary conductive layers farthest from the substrate 110 may be exposed through a mask to form the first interfaces 310a. A portion of the conductive layer used to form the plurality of electrical paths 160 may be patterned to form the second interface 310b.

In summary, using the methods and package structure provided by embodiments of the present invention, a fan-out package structure supporting package-on-package (PoP) application may be manufactured. The flexibility of designing the circuitry and the redistribution layer may be increased. The accuracy and yield of forming the mold layer and the electrical paths through the mold layer may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package method for a package structure comprising;
a substrate comprising a first side, a second side, a circuitry formed between the first side and the second side, and a plurality of first interfaces formed on the first side and configured to be electrically connected with the circuitry;
a chip comprising a top side, a bottom side and a plurality of chip interfaces formed on the bottom side of the chip, and disposed on the first side of the substrate by electrically connecting the plurality of chip interfaces to a first set of the plurality of first interfaces of the substrate respectively, wherein a distance from the top side of the chip to the first side of the substrate is a first height;
a plurality of solder bumps disposed on the first side of the substrate by electrically connecting the plurality of solder bumps to a second set of the plurality of first interfaces of the substrate respectively, each of the plurality of solder bumps having a second height;
a mold layer formed on the first side of the substrate and configured to encapsulate the chip and the plurality of solder bumps;
a plurality of through holes formed in the mold layer and located corresponding to the plurality of solder bumps; and
a plurality of electrical paths formed by filling the plurality of through holes with a conductive material, located corresponding to the plurality of solder bumps, and configured to be electrically connected with the chip via the plurality of solder bumps and the circuitry of the substrate, each of the plurality of electrical paths having a third height;
wherein the first height is substantially equal to a sum of the second height and the third height so that the top side of the chip is substantially exposed from the mold layer to an ambient and a top surface of each of the plurality of electrical paths, a top surface of the mold layer and the top side of the chip are coplanar;
the method comprising:
disposing the chip and the plurality of solder bumps on the substrate by disposing the plurality of chip interfaces and the plurality of solder bumps on the plurality of first interfaces of the substrate respectively;
forming the mold layer configured to encapsulate the chip and the plurality of solder bumps;
grinding the mold layer to obtain a grinded mold layer and expose the top side of the chip;
drilling the grinded mold layer to form the plurality of through holes corresponding to the plurality of solder bumps; and
applying the conductive material to fill the plurality of through holes with the conductive material to form the plurality of electrical paths through the grinded mold layer and electrically couple to the plurality of solder bumps respectively.

2. The package method of claim 1, wherein applying the conductive material to fill the plurality of through holes with the conductive material to form the plurality of electrical paths through the grinded mold layer comprises:
plating the conductive material to fill the plurality of through holes with the conductive material and form a conductive layer over the grinded mold layer; and
removing at least a portion of the conductive layer.

3. The package method of claim 2, wherein removing at least a portion of the conductive layer comprises grinding the conductive layer.

4. The package method of claim 1, wherein drilling the mold layer to form the plurality of through holes comprises:
drilling the mold layer to form the plurality of through holes using laser drilling.

5. The package method of claim 1, further comprising:
disposing a plurality of first solder balls on the plurality of electrical paths respectively;
wherein the plurality of first solder balls are electrically connected with the chip via the plurality of electrical paths.

6. The package method of claim 1, further comprising:
disposing a plurality of second solder balls on a plurality of second interfaces of the substrate respectively;
wherein the plurality of second solder balls are electrically connected with the chip via circuitry of the substrate.

7. A package method for a package structure comprising;
a substrate comprising a first side, a second side, a circuitry formed between the first side and the second side, and a plurality of first interfaces formed on the first side and configured to be electrically connected with the circuitry;
a chip comprising a top side, a bottom side and a plurality of chip interfaces formed on the bottom side of the chip, and disposed on the first side of the substrate by electrically connecting the plurality of chip interfaces to a first set of the plurality of first interfaces of the substrate respectively, wherein a distance from the top side of the chip to the first side of the substrate is a first height;
a plurality of solder bumps disposed on the first side of the substrate by electrically connecting the plurality of solder bumps to a second set of the plurality of first interfaces of the substrate respectively, each of the plurality of solder bumps having a second height;
a mold layer formed on the first side of the substrate and configured to encapsulate the chip and the plurality of solder bumps;
a plurality of through holes formed in the mold layer and located corresponding to the plurality of solder bumps; and
a plurality of electrical paths formed by filling the plurality of through holes with a conductive material, located corresponding to the plurality of solder bumps, and configured to be electrically connected with the chip via the plurality of solder bumps and the circuitry of the substrate, each of the plurality of electrical paths having a third height;
wherein the first height is substantially equal to a sum of the second height and the third height so that the top side of the chip is substantially exposed from the mold layer to an ambient and a top surface of each of the plurality of electrical paths, a top surface of the mold layer and the top side of the chip are coplanar;
the method comprising:
disposing the chip and the plurality of solder bumps on the substrate by disposing the plurality of chip interfaces and the plurality of solder bumps on the plurality of first interfaces of the substrate correspondingly;
forming the mold layer configured to encapsulate the chip and the plurality of solder bumps;
grinding the mold layer to obtain a grinded mold layer and expose the top side of the chip;
drilling the mold layer to form the plurality of through holes corresponding to the plurality of solder bumps;
applying the conductive material to form a conductive layer on the mold layer and fill the plurality of through holes with the conductive material to correspondingly form the plurality of electrical paths electrically coupled to the plurality of solder bumps respectively, the conductive layer covering the plurality of electrical paths; and forming a redistribution layer electrically coupled to the plurality of electrical paths by patterning the conductive layer;

wherein the plurality of solder bumps are electrically connected with the chip via circuitry of the substrate and the plurality of chip interfaces.

8. The package method of claim 7, wherein the redistribution layer comprises a plurality of first interfaces, redistribution circuit circuitry and a plurality of second interface, the plurality of second interfaces of the redistribution layer are electrically connected with the plurality of electrical paths; and the package method further comprises:

disposing a plurality of first solder balls on the plurality of first interfaces of the redistribution layer correspondingly; and disposing a plurality of second solder balls on a plurality of second interfaces of the substrate correspondingly.

9. The package method of claim 7, wherein patterning the conductive layer to form the redistribution layer comprises:

forming a photoresist layer on the conductive layer;

disposing a mask layer with a pattern on the photoresist layer to cover a desired portion of the photoresist layer and expose an undesired portion of the photoresist layer;

exposing the mask layer and the photoresist layer with a specific light to remove the undesired portion of the of the photoresist layer and keep the desired portion of the photoresist layer on the conductive layer, the desired portion of the photoresist layer used to cover and protect a desired portion of the conductive layer;

removing the mask layer;

removing an unwanted portion of the conductive layer;

removing the desired portion of the photoresist layer to expose the desired portion of the conductive layer; and using at least the desired portion of the conductive layer to form the redistribution layer.

10. The package method of claim 9, wherein removing the unwanted portion of the conductive layer comprises:

removing the unwanted portion of the conductive layer by etching the unwanted portion of the conductive layer; and performing a cleaning process to remove unwanted contaminants.

11. The package method of claim 9, further comprising:

forming a solder mask layer on the desired portion of the conductive layer to expose a first portion of the desired portion of the conductive layer to obtain a plurality of interfaces of the redistribution layer; and disposing a plurality of first solder balls on the plurality of interfaces of the redistribution layer;

wherein the plurality of first solder balls are electrically connected with the chip via the redistribution layer, the plurality of electrical paths and the plurality of solder bumps.

12. The package method of claim 11, further comprising:

disposing a plurality of second solder balls on a plurality of second interfaces of the substrate respectively.

13. The package method of claim 9, further comprising:

forming a multi-layer structure on the desired portion of the conductive layer;

forming a solder mask layer on the multi-layer structure to expose a plurality of interfaces of the multi-layer structure;

disposing a plurality of first solder balls on the plurality of interfaces of the multi-layer structure; and disposing a plurality of second solder balls on a plurality of second interfaces of the substrate;

wherein the multi-layer structure comprises X intermediary dielectric layers and Y intermediary conductive layers; using at least the desired portion of the conductive layer to form the redistribution layer comprises using the X intermediary dielectric layers, the Y intermediary conductive layers and the desired portion of the conductive layer to form the redistribution layer; the plurality of first solder balls are electrically connected with the chip via the redistribution layer, the plurality of electrical paths and the plurality of solder bumps; and X and Y are positive integers.

14. The package method of claim 13, further comprising:

disposing a plurality of second solder balls on a plurality of second interfaces of the substrate respectively.

15. The package method of claim 7, wherein drilling the mold layer to form the plurality of through holes comprises:

drilling the mold layer to form the plurality of through holes using laser drilling.

16. A package structure comprising:

a substrate comprising a first side, a second side, a circuitry formed between the first side and the second side, and a plurality of first interfaces formed on the first side and configured to be electrically connected with the circuitry;

a chip comprising a top side, a bottom side and a plurality of chip interfaces formed on the bottom side of the chip, and disposed on the first side of the substrate by electrically connecting the plurality of chip interfaces to a first set of the plurality of first interfaces of the substrate respectively, wherein a distance from the top side of the chip to the first side of the substrate is a first height;

a plurality of solder bumps disposed on the first side of the substrate by electrically connecting the plurality of solder bumps to a second set of the plurality of first interfaces of the substrate respectively, each of the plurality of solder bumps having a second height;

a mold layer formed on the first side of the substrate and configured to encapsulate the chip and the plurality of solder bumps;

a plurality of through holes formed in the mold layer and located corresponding to the plurality of solder bumps; and a plurality of electrical paths formed by filling the plurality of through holes with a conductive material, located corresponding to the plurality of solder bumps, and configured to be electrically connected with the chip via the plurality of solder bumps and the circuitry of the substrate, each of the plurality of electrical paths having a third height;

wherein the first height is substantially equal to a sum of the second height and the third height so that the top side of the chip is substantially exposed from the mold layer to an ambient and a top surface of each of the plurality of electrical paths, a top surface of the mold layer and the top side of the chip are coplanar.

17. The package structure of claim 16, further comprising:

a plurality of first solder balls disposed on the mold layer and electrically connected to the plurality of electrical paths.

18. The package structure of claim 16, wherein:

the substrate further comprises a plurality of second interfaces formed on the second side of the substrate and electrically connected with the circuitry of the substrate; and the package structure further comprises:

a plurality of second solder balls disposed on the plurality of second interfaces of the substrate and configured to be electrically connected with the chip via the circuitry of the substrate.

19. The package structure of claim 16, further comprising:

a conductive layer formed on the mold layer, electrically connected to the plurality of electrical paths, and patterned to form a redistribution layer comprising a plurality of first interfaces, a redistribution circuit, and a plurality of second interfaces electrically coupled to the plurality of electrical paths; and a plurality of first solder balls disposed on the plurality of first interfaces of the redistribution layer, and configured to be electrically connected with the chip via the redistribution circuit, the plurality of electrical paths, and the circuitry of the substrate.

20. The package structure of claim 16, further comprising:

a multi-layer structure formed on the mold layer, electrically connected to the plurality of electrical paths, and comprising a set of dielectric layers and a set of conductive layers to form a redistribution circuit, a plurality of first interfaces and a plurality of second interfaces electrically coupled to the electrical paths; and a plurality of first solder balls disposed on the plurality of first interfaces of the multi-layer structure, and configured to be electrically connected with the chip via the redistribution circuit, the plurality of electrical paths, and the circuitry of the substrate.

\* \* \* \* \*